(12) United States Patent
Mune et al.

(10) Patent No.: US 7,035,516 B2
(45) Date of Patent: Apr. 25, 2006

(54) PROCESS FOR PRODUCING POLYIMIDE OPTICAL WAVEGUIDE

(75) Inventors: Kazunori Mune, Osaka (JP); Ryuusuke Naitou, Osaka (JP); Amane Mochizuki, Osaka (JP)

(73) Assignee: Nitto Denko Corporation, Osaka (JP)

( * ) Notice: Subject to any disclaimer, the term of this patent is extended or adjusted under 35 U.S.C. 154(b) by 143 days.

(21) Appl. No.: 10/724,165

(22) Filed: Dec. 1, 2003

(65) Prior Publication Data

US 2004/0146263 A1 Jul. 29, 2004

(30) Foreign Application Priority Data

Nov. 29, 2002 (JP) .................... P.2002-346996

(51) Int. Cl.
*G02B 6/10* (2006.01)

(52) U.S. Cl. .............. 385/129; 385/131; 385/143; 385/145; 430/321; 430/18

(58) Field of Classification Search ......... 385/129–131, 385/141–145; 430/18, 281.1, 321, 906, 270.1
See application file for complete search history.

(56) References Cited

U.S. PATENT DOCUMENTS

| 5,317,082 | A | * | 5/1994 | Beuhler et al. | 528/353 |
| 5,449,742 | A | * | 9/1995 | Beuhler et al. | 528/353 |
| 5,649,045 | A | * | 7/1997 | Fjare et al. | 385/145 |
| 6,389,215 | B1 | * | 5/2002 | Lindsay et al. | 385/145 |
| 6,800,425 | B1 | * | 10/2004 | Naitou et al. | 430/321 |
| 2004/0013953 | A1 | * | 1/2004 | Mune et al. | 430/18 |

FOREIGN PATENT DOCUMENTS

| EP | 0 675 409 B1 | 8/1998 |
| EP | 0 884 610 A2 | 12/1998 |
| EP | 0 909 949 A2 | 4/1999 |
| EP | 1 205 804 A2 | 5/2002 |
| EP | 1 382 644 A1 | 1/2004 |
| EP | 1 385 027 A1 | 1/2004 |
| JP | 6-46348 A | 2/1994 |
| JP | 7-179604 A | 7/1995 |
| JP | 7-234525 A | 9/1995 |
| JP | 2002-31732 A | 1/2002 |
| JP | 2002-350661 A | 4/2002 |

OTHER PUBLICATIONS

Patent Abstracts of Japan, Mochizuki Shu, "Photosensitive Polyimide Precursor Composition, Photosensitive Polyimide and Optical Waveguide Using the Same" (2000).
Search Report dated May 25, 2004.

* cited by examiner

*Primary Examiner*—Akm Enayet Ullah
*Assistant Examiner*—Kevin S. Wood
(74) *Attorney, Agent, or Firm*—Sughrue Mion, PLLC

(57) ABSTRACT

A process for producing a polyimide optical waveguide, including: (a) forming an undercladding layer on a substrate, (b) forming a photosensitive polyimide resin precursor composition layer on the undercladding layer, (c) irradiating the photosensitive polyimide resin precursor composition layer, excepting a region corresponding to a core pattern, with a UV light through a mask, followed by heating (d) removing a UV-unexposed area of the layer by development, (e) heating a UV-exposed area of the layer to imidize the UV-exposed area, thereby forming a cladding layer having a desired pattern, (f) coating the region corresponding to the core pattern and a surface of the cladding layer with a polyamic acid that forms a polyimide resin having a higher refraction index than the polyimide resin of the cladding layer, and imidizing the polyamic acid by heating to form a core layer, and (g) forming an overcladding layer on the core layer.

11 Claims, 3 Drawing Sheets

PROCESS FOR PRODUCING POLYIMIDE OPTICAL WAVEGUIDE

FIELD OF THE INVENTION

The present invention relates to a process for producing a polyimide optical waveguide, and more particularly to a process for producing a polyimide optical waveguide such as a straight optical waveguide, a curved optical waveguide or a branched optical waveguide, which are broadly used in optical communication, optical information processing and other general optical fields.

BACKGROUND OF THE INVENTION

With the progress of practical application of optical communication systems by the development of optical fibers, development of various optical communication devices using an optical waveguide structure has been demanded. In general, characteristics required for optical waveguide materials include low light propagation loss, possession of heat resistance and humidity resistance, and controllability of the refraction index and film thickness. With respect to these requirements, silica-based optical waveguides have hitherto been chiefly investigated.

However, in construction of optical fiber networks inclusive of WDM communication, it is essential to reduce costs for fabricating various devices. Accordingly, in order to apply polymer materials that can be mass-produced and subjected to large-area processing to optical waveguide materials, organic materials inclusive of polymethyl methacrylate, a polycarbonate and polystyrene have been investigated in recent years. However, when such polymers are subjected to hybrid integration with a laser diode, a photo diode, etc., they have the defect that the range of their use is very limited, because their heat resistance in a solder reflow step is not sufficient. Of a number of polymer materials, polyimide resin-based materials have the highest heat resistance, so that they have recently attracted a great deal of attention as optical waveguide materials.

Optical circuits made of a polyamide resin have hitherto been generally formed by the following dry process. That is, a polyamic acid as a polyimide resin precursor is first dissolved in a polar solvent such as N,N-dimethylacetamide or N-methyl-2-pyrrolidone to prepare a polyamic acid varnish, which is then applied onto a substrate by spin coating or casting and heated to remove the solvent and to allow the polyamic acid to undergo ring closure for imidation, thereby forming a polyimide resin film, followed by pattern formation by reactive ion etching (RIE) using oxygen plasma etc.

However, according to the conventional dry process in which the polyimide resin film is subjected to reactive ion etching to form a pattern as described above, not only it takes a long period of time to form an optical circuit, but also the problem of reducing costs is not solved yet, because a processing region is restricted. Further, according to such a dry process, a wall surface (side surface) of the pattern formed is not flat, so that scattering loss becomes large during wave guiding of light into the optical circuit.

Consequently, as an inexpensive process for producing optical waveguides without using such a dry process, for example, a so-called release layer process is known (see, for example, Patent Document 1). However, also in this release layer process, there is fear that material characteristics, as well as the durability and mold release properties of a transfer mold, are degraded by immersing a member in an etching solution in order to remove the release layer.

In contrast, as already known, when pattern formation using a polyimide resin is conducted by a wet process using a photosensitive polyimide resin precursor composition in which a 1,4-dihydropyridine derivative is incorporated as a photosensitive agent (see, for example, Patent Documents 2 to 4), the above-mentioned problems are not encountered. However, a new problem of light loss with respect to the resulting polyimide resin must be solved. Specifically, in order to use the polyimide resin by the above-mentioned wet process as an optical waveguide material, the polyimide resin is required not to absorb a light to be guided, namely, it must be low in loss to a light, and in brief, it must have transparency.

However, in order to subject the above-mentioned photosensitive polyimide resin precursor composition to the pattern formation by the wet process to prepare the optical waveguide provided with a core layer comprising a polyimide resin, the pattern formation is conducted using the photosensitive polyimide resin precursor composition as a starting material, to which photosensitivity is imparted by blending a photosensitive agent with a polyamic acid which is a polyimide resin precursor, followed by heating to allow the polyamic acid to undergo ring closure and curing (imidation), as described above. In this case, there is the problem that the above-mentioned photosensitive agent is thermally decomposed to color the resulting polyimide resin black. Therefore, according to the wet process using the conventional photosensitive polyimide resin precursor composition as described above, improvement in the low loss property has a limitation even when the amount of the photosensitive agent used is reduced. It is therefore impossible to sufficiently exhibit the low loss property originally possessed by polyimide.

Patent Document 1: JP 2002-031732 A
Patent Document 2: JP 6-43648 A
Patent Document 3: JP 7-179604 A
Patent Document 4: JP 7-234525 A

SUMMARY OF THE INVENTION

In order to solve the above-mentioned problems in the production of optical waveguides by the wet process using the above-mentioned photosensitive polyimide resin precursor compositions, the present inventors made extensive investigations. As a result, it was found that an optical waveguide extremely low in loss sufficiently exhibiting the low loss property originally possessed by a polyimide resin can be produced by forming a cladding layer of the optical waveguide through pattern formation of the above-mentioned photosensitive polyimide resin precursor composition according to a wet process. Thus, the invention has been accomplished.

Accordingly, the invention has been made to solve various problems including the production cost in the conventional optical waveguide materials, particularly to solve the above-mentioned problems in the conventional production of the optical waveguides using photosensitive polyimide resin precursor compositions in which the photosensitive agents are incorporated, and an object of the invention is to provide a process for inexpensively producing a polyimide optical waveguide having extremely low loss property through a wet process, by using the above-mentioned pattern formation of a photosensitive polyimide resin precursor composition in the production of a cladding layer of an optical waveguide.

According to the invention, there is provided a process for producing a polyimide optical waveguide, which comprises the steps of:

(a) forming an undercladding layer on a substrate, (b) forming a photosensitive polyimide resin precursor composition layer on the undercladding layer, (c) irradiating the photosensitive polyimide resin precursor composition layer, excepting a region corresponding to a core pattern, with a UV light through a mask, followed by heating after exposure, (d) removing a UV-unexposed area of the photosensitive polyimide resin precursor composition layer by development, (e) heating a UV-exposed area of the photosensitive polyimide resin precursor composition layer to imidize the UV-exposed area, thereby forming a cladding layer having a desired pattern, (f) coating the region corresponding to the core pattern and a surface of the cladding layer with a polyamic acid that forms a polyimide resin having a higher refraction index than the polyimide resin of the cladding layer, and imidizing the polyamic acid by heating to form a core layer, and (g) forming an overcladding layer on the cladding layer, wherein the photosensitive polyimide resin precursor composition comprises:

(i) a polyamic acid obtained from a tetracarboxylic dianhydride and a diamine, and (ii) a photosensitive agent comprising a 1,4-dihydropyridine derivative represented by formula (I):

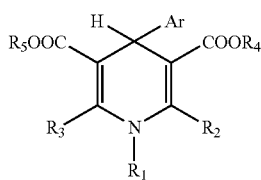

wherein Ar represents an aromatic group having a nitro group at an ortho-position with respect to the bonding position to the 1,4-dihydropyridine ring; $R_1$ represents a hydrogen atom or an alkyl group having 1 to 3 carbon atoms; and $R_2$, $R_3$, $R_4$ and $R_5$ each independently represents a hydrogen atom or an alkyl group having 1 or 2 carbon atoms.

Figure 1:
FIGS. 1(A) to 1(D) are schematic views showing a process for producing a polyimide optical waveguide according to the invention.
Figure 1:
Figure 1:
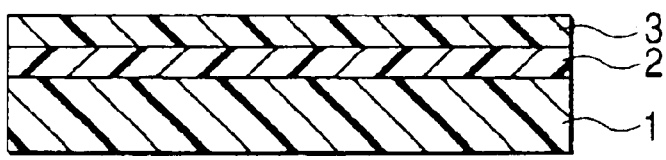
Figure 1:
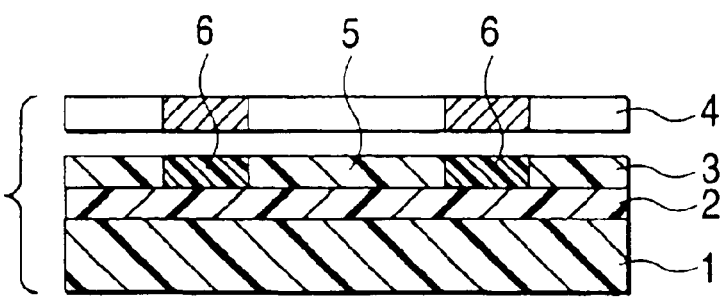

The reference numerals used in the drawings respectively represent the followings.

1: Substrate
2: Undercladding layer
3: Photosensitive polyimide resin precursor composition
4: Mask
5: UV-exposed area
6: UV-unexposed-area
7, 11: (Side) Cladding Layer
8, 10, 10a, 10b: Core Layer
9: Overcladding Layer

DETAILED DESCRIPTION OF THE INVENTION

The photosensitive polyimide resin precursor composition for use in the invention comprises:

(i) a polyamic acid obtained from a tetracarboxylic dianhydride and a diamine, and (ii) a photosensitive agent comprising a 1,4-dihydropyridine derivative represented by formula (I):

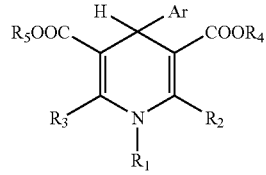

wherein Ar represents an aromatic group having a nitro group at an ortho-position with respect to the bonding position to the 1,4-dihydropyridine ring; $R_1$ represents a hydrogen atom or an alkyl group having 1 to 3 carbon atoms; and $R_2$, $R_3$, $R_4$ and $R_5$ each independently represents a hydrogen atom or an alkyl group having 1 or 2 carbon atoms.

In the invention, the tetracarboxylic dianhydride is not particularly limited, and examples thereof include pyromellitic anhydride, 3,3',4,4'-biphenyltetracarboxylic dianhydride, 2,2-bis(2,3-dicarboxyphenyl)propane dianhydride, 2,2-bis(3,4-dicarboxyphenyl)propane dianhydride, 3,3',4,4'-benzophenonetetracarboxylic dianhydride, bis-3,4-dicarboxyphenyl)ether dianhydride and bis(3,4-dicarboxyphenyl)sulfonic dianhydride.

However, according to the invention, it is particularly preferred that the tetracarboxylic dianhydride is one containing a fluorine atom in its molecule (hereinafter referred to as a "fluorine-substituted tetracarboxylic dianhydride"). Such tetracarboxylic dianhydrides include, for example, 2,2-bis (3,4-dicarboxyphenyl)hexafluoropropane dianhydride, 4,4-bis(3,4-dicarboxytrifluorophenoxy) tetrafluorobenzene dianhydride, 1,4-bis(3,4-dicarboxytrifluorophenoxy)tetrafluorobenzene dianhydride, (trifluoromethyl)pyromellitic dianhydride, di(trifluoromethyl)pyromellitic dianhydride and di(heptafluoropropyl)pyromellitic dianhydride.

On the other hand, the diamines include, for example, m-phenylenediamine, p-phenylenediamine, 3,4'-diaminodiphenyl ether, 4,4'-diaminodiphenyl ether, 4,4'-diaminodiphenylsulfone, 3,3'-diaminodiphenylsulfone, 2,2-bis (4-aminophenoxyphenyl)propane, 1,3-bis(4-aminophenoxy)-benzene, 1,4-bis(4-aminophenoxy) benzene, 2,4-diamino-toluene, 2,6-diaminotoluene, 4,4'-diaminodiphenylmethane and 4,4'-diamino-2,2'-dimethylbiphenyl.

Similarly to the tetracarboxylic dianhydride, according to the invention, it is particularly preferred that the diamine is one containing a fluorine atom in its molecule (hereinafter referred to as a "fluorine-substituted diamine"). Such diamines include, for example, 2,2'-bis(trifluoromethoxy)-4,4'-diaminobiphenyl (TFMOB), 3,3'-diamino-5,5'-bis (trifluoromethyl)biphenyl, 2,2-bis(4-aminophenyl) hexafluoropropane (BAAF), 2,2-bis[4-(4-aminophenoxy) phenyl]hexafluoropropane (HFBAPP), 2,2'-bis (trifluoromethyl) -4,4'-diaminobiphenyl (TFMB), 2,2-bis(3-amino-4-hydroxyphenyl) hexafluoropropane (BIS-AP-AF), 2,2-bis (3-amino-4-methylphenyl)hexafluoroprpoane (BIS-AT-AF), 2,2'-difluorobenzidine (FBZ), 4,4'-bis (aminooctafluoro)-biphenyl, 3,5-diaminobenzotrifluoride and 1,3-diamino-2,4,5,6-tetrafluorobenzene.

According to the invention, the introduction of a fluorine atom into the structure of the polyamic acid as described above can decrease the exposure amount necessary for exposing the photosensitive polyimide resin precursor composition, compared to that for the conventional photosensitive polyimide resin precursor compositions. In the conventional photosensitive polyimide resin precursor compositions, the proper exposure amount is from 300 to 1000 mJ/cm$^2$ whereas according to the photosensitive polyimide resin precursor composition in which fluorine atoms are introduced into the structure of the polyamic acid, sufficient resolution can be attained by an exposure amount ranging from 5 to 20 mJ/cm$^2$.

According to the invention, the polyamic acid can be obtained by reacting the tetracarboxylic dianhydride as described above with the diamine as described above in accordance with a conventional method. Specifically, for example, to a solution in which a diamine is dissolved in an appropriate organic solvent, a tetracarboxylic dianhydride is added in an equimolar amount to the diamine in an atmosphere of nitrogen, and the resulting mixture is stirred at room temperature for about 5 to about 20 hours, whereby the polyamic acid can be obtained as a viscous solution.

The solvent is not particularly limited as long as it has hitherto been used for the production of polyamic acids. For example, polar solvents such as N,N-dimethylacetamide (DMAc) and N-methyl-2-pyrrolidone (NMP) are preferably used, and DMAc is particularly preferably used because it does not thermally decompose and has excellent transparency.

In the photosensitive polyimide resin precursor composition for use in the invention, the 1,4-dihydropyridine derivative represented by the above-mentioned general formula (I) is blended, as a photosensitive agent, with the polyamic acid described above.

Specific examples of the photosensitive agents include 1-ethyl-3,5-dimethoxycarbonyl-4-(2-nitrophenyl)-1,4-dihydropyridine, 1-methyl-3,5-dimethoxycarbonyl-4-(2-nitrophenyl) -1,4-dihydropyridine, 1-propyl-3,5-dimethoxycarbonyl -4-(2-nitrophenyl)-1,4-dihydropyridine and 1-propyl -3,5-diethoxycarbonyl-4-(2-nitrophenyl)-1,4-dihydropyridine.

According to the invention, of the various photosensitive agents described above, 1-ethyl-3,5-dimethoxycarbonyl -4-(2-nitrophenyl)-1,4-dihydropyridine (hereinafter referred to as "EDHP") is particularly preferably used from the viewpoints of low cost and low light absorption by the C—H bond.

Such a 1,4-dihydropyridine derivative can be obtained, for example, by reacting a substituted benzaldehyde, an alkyl propiolate (an alkyl ester of propargylic acid) in a molar amount of two times the amount of the substituted benzaldehyde, and a corresponding primary amine in glacial acetic acid under reflux (*Khim. Geterotsikl. Soed.*, pp. 1067–1071, 1982).

According to the invention, such a photosensitive agent is used preferably in an amount ranging from 0.05 to 10 parts by weight, more preferably in an amount ranging from 0.5 to 3 parts by weight, per 100 parts by weight of the polyamic acid. When the photosensitive polyimide resin precursor composition is prepared by using the photosensitive agent in an amount exceeding 10 parts by weight per 100 parts by weight of the polyamic acid, the resulting polyimide resin is caused to absorb a light in a near infrared region. The use of such a polyimide resin as the cladding layer of the optical waveguide contributes to loss, when the light reflects in a core/clad interface. On the other hand, when the blending ratio of the photosensitive agent is less than 0.05 part by weight per 100 parts by weight of the polyamic acid, it is difficult to obtain a pattern having a sufficient contrast, even when the resulting photosensitive polyimide resin precursor composition is irradiated with a UV light and developed.

Further, according to the invention, at least one dissolution controlling agent selected from the group consisting of polyethylene glycol, polyethylene glycol monomethyl ether and polyethylene glycol dimethyl ether can be blended with the polyamic acid as needed, in addition to the photosensitive agent, to prepare the photosensitive polyimide resin precursor composition.

Such a dissolution controlling agent has a weight average molecular weight ranging generally from 200 to 2,000, and preferably from 300 to 1,000. According to the invention, the dissolution controlling agent is volatilized out of the resin together with the residual solvent upon heating the polyamic acid for curing (imidation) and hence dose not finally remain in the resin. Accordingly, the dissolution controlling agent does not adversely affect characteristics required for resins for optical use, such as transparency of the polyimide resin to be formed.

According to the invention, when the resin film comprising the resulting photosensitive polyimide resin precursor composition is exposed by light irradiation and then developed, the use of the dissolution controlling agent causes a remarkable difference in solubility to a developing solution between an exposed area and an unexposed area of the resin film. Thus, the unexposed area can be removed by dissolution without substantially dissolving the exposed area in the development, so that the film remainder rate of the resin film can be improved.

Such a dissolution controlling agent is used in an amount ranging preferably from 5 to 50 parts by weight, and particularly preferably from 10 to 40 parts by weight, per 100 parts by weight of the polyaminc acid. When the ratio of the dissolution controlling agent is less than 5 parts by weight per 100 parts by weight of the polyamic acid, the effect of suppressing reduction in thickness of the resin film (i.e., film reduction) is poor, in developing the resin film comprising the resulting photosensitive polyimide resin precursor composition after the development, and the film remainder ratio after the development is usually 50% or less. On the other hand, exceeding 50 parts by weight results in poor compatibility with the polyamic acid, which causes the possibility of resolution being decreased.

According to the invention, such blending of the photosensitive agent and the dissolution controlling agent with the polyamic acid can provide the photosensitive polyimide resin precursor composition having high photosensitivity. Moreover, according to such a photosensitive polyimide resin precursor composition, it is possible to conduct processing with a large area. That is, the conventional pattern formation in optical elements is performed by the dry process inclusive of reactive ion etching as described above, so that it takes a long period of time to work and is poor in mass production. In contrast, the pattern formation using the photosensitive polyimide resin precursor composition according to the invention is free from these defects, and can greatly reduce the processing cost.

The photosensitive polyimide resin precursor composition for use in the invention is, for example, applied to the surface of a substrate such as a silicon substrate, a silica substrate, a metal foil, a glass plate or a polymer film, and initially dried to form a layer of the photosensitive polyimide resin precursor composition. Then, the resin layer is irradiated with a UV light through a glass mask so as to obtain a desired pattern. Subsequently, the resin layer is heated in air at a temperature of 160 to 200° C., preferably 170 to 190° C., after exposure in order to complete the photoreaction in the resin layer. Then, the resin layer after heating is developed, i.e., the UV-unexposed area is dissolved to remove, and the thus obtained desired pattern is further heated to undergo imidation. The heating temperature is usually within the range of 300 to 400° C., and desolvation and curing reaction are conducted under vacuum or in an atmosphere of nitrogen. Thus, a pattern comprising the polyimide resin can be obtained. The layer thickness of polyimide resin can be controlled by the solid concentration and viscosity of the photosensitive polyimide resin precursor composition, film formation conditions, etc.

The method for applying the photosensitive polyimide resin precursor composition to the surface of the substrate, cladding layer or core layer is not particularly limited, and a general film formation method such as spin coating or casting can be employed. Further, an alkaline aqueous solution is usually used as the developing solution for use in the above-mentioned development.

According to the invention, the cladding layer is formed by the wet process using the above-mentioned photosensitive polyimide resin precursor composition, and a polyamic acid obtained from a diamine and a tetracarboxylic dianhydride is applied onto a region defined as a core pattern (i.e., the region other than the cladding layer), followed by heating and imidation to form the core layer, thereby making it possible to obtain an optical waveguide taking advantage of the low loss property originally possessed by polyimide resins.

Examples of the optical waveguide according to the invention include, for example, a straight optical waveguide, a curved optical waveguide, a multi-layered optical waveguide, a crossing optical waveguide, a Y-branched optical waveguide, a slab optical waveguide, a Mach-Zehnder type optical waveguide, an AWG type optical waveguide, a grating and an optical waveguide lens. Optical elements using these waveguides include a wavelength filter, an optical switch, an optical branch unit, an optical multiplexer, an optical multiplexer/demultiplexer, an optical amplifier, a wavelength modulator, a wavelength division multiplexer, an optical splitter, a directional coupler and further an optical transmission module having a laser diode or a photodiode by hybrid integration. Further, the waveguide according to the invention can also be formed on a conventional electric wiring board.

According to the invention, first, an undercladding layer is formed on an appropriate substrate, and then, the photosensitive polyimide resin precursor composition comprising the photosensitive agent and dissolution controlling agent blended with the polyamic acid having fluorine atoms introduced into its structure as described above is applied onto the undercladding layer, followed by drying to form a photosensitive polyimide resin precursor composition layer. Then, the photosensitive polyimide resin precursor composition layer is irradiated with a UV light through a mask, except for a region corresponding to a core pattern, and then, heated after exposure to form a UV-exposed area and a UV-unexposed area in the photosensitive polyimide resin precursor composition layer.

Subsequently, the UV-unexposed area of the photosensitive polyimide resin precursor composition layer is removed by development, followed by further heating to imidize the UV-exposed area, thereby forming a cladding layer having a required pattern in the region excluding the region corresponding to the core pattern. In other words, according to the present invention, the patterned cladding layer is formed to define the excluded region as the core pattern.

Then, a polyamic acid that forms a polyimide resin having a higher refraction index than the polyimide resin of the cladding layer is applied to the region corresponding to the core pattern and the surface of the cladding layer, and heated to imidize the polyamic acid, thereby forming a core layer. Then, an overcladding layer is formed on the core layer to obtain an embedded type polyimide optical waveguide.

When obtaining an embedded type optical waveguide structure in this way, i.e., by forming the undercladding layer, forming the polyimide layers having the core layer and the cladding layer on the undercladding layer, and further forming the overcladding layer on the polyimide layers, it is necessary to make the refraction index of the cladding layer positioned around the core layer lower than that of the core layer. From the viewpoint of contrast, the refraction index is preferably the same all over the claddings surrounding the core layer. Accordingly, for example, the overcladding layer and the undercladding layer can be formed from the same polyimide.

As described above, in the optical waveguide, the refraction index of the core layer must be higher than that of the cladding layer. Generally, the difference Δ in the specific refraction index between these two layers may be about 0.2% to about 1.0% in the case of a single mode. The difference Δ in the specific refraction index is expressed by the following equation:

$$\Delta = ((n(\text{core}) - n(\text{clad}))/n(\text{core})) \times 100\%$$

wherein "n(core)" represents the refraction index of the core layer, and "n(clad)" represents the refraction index of the cladding layer.

The process for producing the polyimide optical waveguide according to the invention will be described in detail below.

According to the process of the invention, an appropriate substrate 1 is first prepared as shown in FIG. 1(A), and an undercladding layer 2 is formed on the substrate 1 as a first step (a), as shown in FIG. 1(B). The undercladding layer may be formed, for example, from a polyimide in accordance with a conventional method. Herein, the polyimide used and the method thereof are not particularly limited. The undercladding layer may be formed by applying the photosensitive polyimide resin precursor composition as described above onto the substrate, drying the applied composition, and heating the dried composition as such without exposure to cure (imidize) it. The heating (imidation) temperature is usually within the range of 300 to 400° C., and the polyamic acid is cured while conducting desolvation under vacuum or in an atmosphere of nitrogen.

As the substrate, one that has hitherto been known is appropriately used. Examples thereof include but are not limited to a silicon substrate, a synthetic silica glass substrate, a metal foil, a glass plate or a polymer film.

Then, the photosensitive polyimide resin precursor composition described above is applied onto the undercladding layer 2, and dried to form a photosensitive polyimide resin precursor composition layer 3 as a second step (b), as shown in FIG. 1(C). The method for applying the photosensitive polyimide resin precursor composition onto the surface of the substrate is not particularly limited and, for example, general film formation methods such as spin coating or casting can be used.

Then, the photosensitive polyimide resin precursor composition layer is irradiated with a UV light through a mask 4, except for the region corresponding to a predetermined core pattern, and then heated after exposure to form a UV-exposed area 5 and a UV-unexposed area 6 in the photosensitive polyimide resin precursor composition layer as a third step (c), as shown in FIG. 1(D). As the irradiating means of the UV light, an ordinary high-pressure mercury lamp which has generally been used for UV light irradiation of photosensitive resins can be used.

Figure 2:
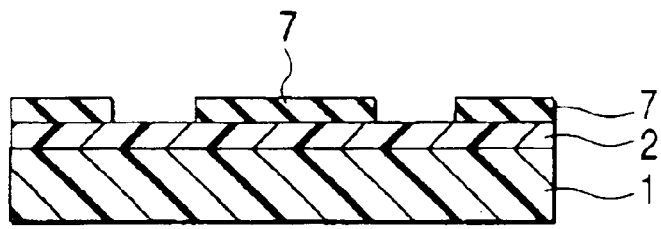
FIGS. 2(E) to 2(H) are schematic views showing a process for producing a polyimide optical waveguide according to the invention.
Figure 2:
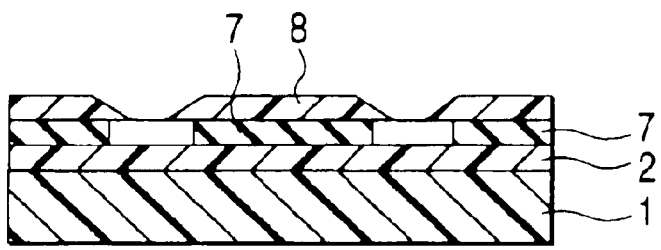
Figure 2:
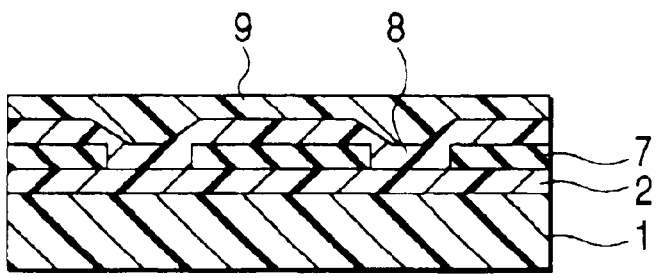
Figure 2:
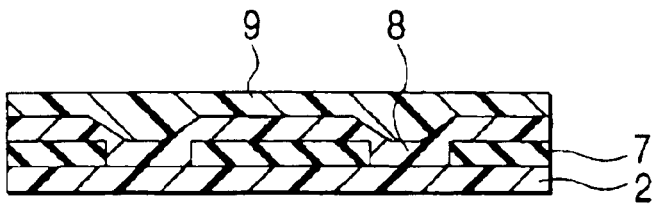

Then, according to the invention, the UV-exposed area is developed, i.e., the UV-unexposed area is removed, to form a required pattern for a cladding layer, which is heated to imidize it, thereby obtaining the cladding layer 7 comprising the polyimide resin as a fourth step (d), as shown in FIG. 2(E).

Then, a polyimide resin having higher refraction index than the polyimide resin of the cladding layer is formed as a core layer 8 on the region corresponding to the core pattern and the surface of the cladding layer as a fifth step (e), as shown in FIG. 2(F). The core layer may be formed from the polyimide resin by a conventional method. Herein, the polyimide used and the method thereof are not particularly limited. Accordingly, for example, an appropriate polyamic acid is applied onto the region corresponding to the core pattern and the surface of the cladding layer, and heated to imidize the polyamic acid, thereby forming a core layer 8 so as to be embedded in the region corresponding to the core pattern.

Figure 3:
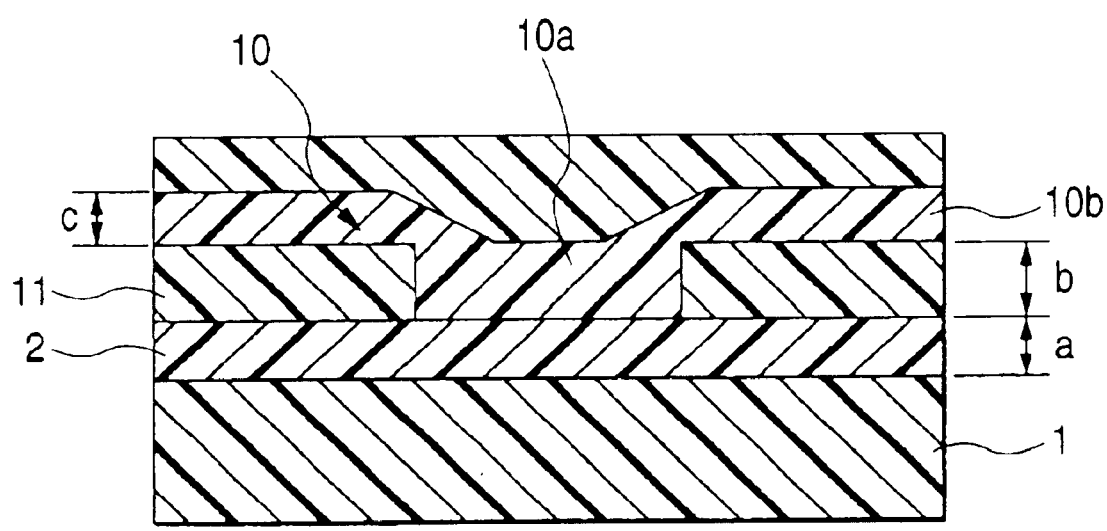
FIG. 3 is a cross sectional view showing an example of an optical waveguide obtained by the process of the invention.

As shown in detail in FIG. 3, the core layer 10 thus formed has a difference in level between a core layer 10a formed on the region corresponding to the core pattern (in other words, on the undercladding layer) and a core layer 10b formed on a cladding layer 11, and becomes higher on the cladding layer 11.

After the core layer 8 is thus formed as shown in FIG. 2(F), an overcladding layer 9 is formed on the core layer as a sixth step, as shown in FIG. 2(G), whereby an embedded type optical waveguide can be obtained.

Similarly to the undercladding layer 2, the overcladding layer on the core layer may also be formed, for example, from a polyimide in accordance with a conventional method. Also in this case, the polyimide used and the method thereof are not particularly limited. The overcladding layer may be formed by applying the photosensitive polyimide resin precursor composition described above may be applied onto the core layer, drying the applied composition, and then heating the dried composition as such without exposure to cure (imidize) it.

An embedded type flexible optical waveguide can also be produced similarly to the above-mentioned embedded type optical waveguide. That is, an undercladding layer, a cladding layer, a core layer and an overcladding layer are formed in this order, on a substrate comprising a material which can be etched in the final step and can be separated from the undercladding layer, in the same manner as in the embedded type optical waveguide described above. Then, the substrate 1 is removed by etching as shown in FIG. 2(H), whereby an embedded type flexible optical waveguide can be obtained. The substrate is not particularly limited as long as it satisfies the above-mentioned prescribed properties. For example, a metal, an inorganic material, an organic film or the like can be used.

As described above, according to the invention, pattern formation of the photosensitive polyimide resin precursor composition is carried out by the wet process to form the cladding layer, and a polyimide is formed from a polyamic acid in the region for forming the core layer defined by the patterned cladding layer, followed by the formation of the core layer.

Therefore, according to the process of the invention, the core layer is formed by a polyimide resin derived from an ordinary polyamic acid containing no photosensitive agent, so that an optical waveguide sufficiently taking advantage of the low loss property originally possessed by a polyimide resin can be obtained, while utilizing the pattern formation of the photosensitive polyimide resin precursor composition by the wet process.

EXAMPLES

The invention will be illustrated in greater detail with reference to the following Examples and Comparative Example, but it should not be construed that the invention is limited by these examples.

Reference Example 1
Preparation of Polyamic Acid Varnish A for Core

In an atmosphere of nitrogen, a solution of 8.81 g (0.04 mole) of 2,2'-bis(fluoro)benzidine (FBZ) in N,N-dimethylacetamide (79.7 g) was prepared in a 300-ml separable flask, and 17.8 g (0.04 mole) of 2,2-bis(3,4-dicarboxyphenyl) hexafluoropropane dianhydride (6FDA) was added thereto with stirring, followed by stirring at room temperature for 24 hours to obtain a polyimide precursor (hereinafter referred to as "polyamic acid varnish A").

Reference Example 2
Preparation of Polyamic Acid Varnish B for Clad

In an atmosphere of nitrogen, a solution of 28.8 g (0.09 mole) of 2,2'-bis(trifluoromethyl)-4,4'-diaminobiphenyl (TFMB) in N,N-dimethylacetamide (275.2 g) was prepared in a 300-ml separable flask, and 40.0 g (0.09 mole) of 2,2-bis(3,4-dicarboxyphenyl)hexafluoropropane dianhydride (6FDA) was added thereto with stirring, followed by stirring at room temperature for 24 hours to obtain a polyimide precursor (hereinafter referred to as "polyamic acid varnish B").

Reference Example 3
Preparation of Photosensitive Polyamic Acid Varnish C

To a beaker, 100 g of the above-mentioned polyamic acid varnish B was taken out. Based on the solid content of the polyamic acid varnish, 2% by weight (0.4 g) of EDHP (photosensitive agent), and 15% by weight (3.0 g) of polyethylene glycol dimethyl ether (dissolution controlling agent; weight average molecular weight: 500) were added thereto, followed by stirring to obtain homogeneous photosensitive polyamic acid varnish C.

Example 1
Production of Optical Waveguide

The above-mentioned polyamic acid varnish B was applied onto a synthetic silica glass substrate having a thickness of 1.0 mm by spin coating, and dried by heating at 90° C. for about 15 minutes, followed by heating at 36° C. for 2 hours in a vacuum atmosphere to imidize it, thereby forming an undercladding layer on the substrate. When measured with a contact type film thickness meter, the thickness of the undercladding layer was 10 μm.

Then, the above-mentioned photosensitive polyamic acid varnish C was applied onto the undercladding layer by spin coating, and dried by heating at 90° C. for about 15 minutes. Thereafter, a negative glass mask on which 70-mm long patterns having a line width of 10 μm were drawn at 100-μm spacing was placed thereon, and the whole surface thereof was irradiated with a UV light of 10 mJ/cm$^2$ from above, followed by further heating at 170° C. for 10 minutes. The thickness of the resin layer thus exposed and heated after exposure was 14 μm.

The resin layer after exposure was developed at 35° C. with an alkaline aqueous solution of ethanol containing tetramethylammonium hydroxide, and rinsed with water to form a cladding layer having desired patterns. The thickness of the resin layer after development was 12 μm. Then, the resin layer was heated at 380° C. for 2 hours in a vacuum atmosphere to remove the remaining solvent and complete imidation of the resin. The thickness of a cladding layer comprising the polyimide resin thus obtained was 10 μm.

Then, using the thus-obtained substrate having the cladding layer comprising the polyimide resin as a base, polyamic acid varnish A that forms a polyimide resin having higher refraction index than the polyimide resin was applied onto the whole surface of the undercladding layer including the above-mentioned cladding layer by spin coating, and heated at 350° C. for 2 hours in a vacuum atmosphere to thereby form a core layer embedded in a concave portion defined by the patterned cladding layer for the core layer.

In the polyimide optical waveguide thus obtained, the thickness of the core layer on the surface of the cladding layer (thickness: c) was 5 μm, and the thickness on the undercladding layer was 12 μm, as shown in FIG. 3. In other words, the portion of the core layer formed on the undercladding layer caved in about 3 μm from the portion of the core layer formed on the surface of the cladding layer having a thickness of 10 μm.

Finally, the above-mentioned polyamic acid varnish B was applied onto the surface of the core layer by spin coating, and heated at 350° C. for 2 hours to form an overcladding layer. The thickness of the overcladding layer was 10 μm.

Thus, an embedded type optical waveguide which comprises the synthetic silica substrate, the undercladding layer (bottom cladding layer) comprising a polyimide, the cladding layer (side cladding layer) comprising a polyimide derived from the photosensitive polyimide resin precursor composition, the core layer comprising a polyimide and the overcladding layer comprising a polyimide was obtained. Then, after the optical waveguide was subjected to end face treatment, a light having a wavelength of 1,300 nm was passed, and the light propagation loss was measured by a cut-back method. As a result, it was found to be 0.2 dB/cm.

Examples 2 to 5

Optical waveguides were obtained in the same manner as in Example 1 with the exception that the thickness of the bottom cladding layer (thickness: a), the thickness of the side cladding layer (thickness: b) and the thickness of the core layer on the side cladding layer (thickness: c) as shown in FIG. 3 were changed. For these optical waveguides, the light propagation loss was measured in the same manner as in Example 1, and the results shown in Table 1 were obtained.

TABLE 1

| | Example | | | | |
|---|---|---|---|---|---|
| | 1 | 2 | 3 | 4 | 5 |
| Thickness (μm) | | | | | |
| Thickness (a) of Undercladding Layer a | 10 | 16 | 10 | 5 | 30 |
| Thickness (b) of Cladding Layer b | 10 | 10 | 5 | 5 | 30 |
| Thickness (c) of Core Layer | 5 | 5 | 3 | 3 | 15 |
| Propagation Loss (dB/cm) | 0.1 | 0.15 | 0.15 | 0.1 | 0.2 |

Comparative Example 1

Production of Optical Waveguide

The above-mentioned polyamic acid varnish B was applied onto a synthetic silica glass substrate having a thickness of 1.0 mm by spin coating, and dried by heating at 90° C. for about 15 minutes, followed by heating at 36° C. for 2 hours in a vacuum atmosphere to imidize it, thereby forming an undercladding layer on the substrate. When measured with a contact type film thickness meter, the thickness of the undercladding layer was 10 μm.

Then, the above-mentioned photosensitive polyamic acid varnish C was applied onto the undercladding layer by spin coating, and dried by heating at 90° C. for about 15 minutes. Thereafter, a positive glass mask on which 70-mm long patterns having a line width of 10 μm were drawn at 100-μm spacing was placed thereon, and the whole surface thereof was irradiated with a UV light of 10 mJ/cm² from above, followed by further heating at 170° C. for 10 minutes. The thickness of the resin layer thus exposed and heated after exposure was 14 μm.

The resin layer was developed at 35° C. with an alkaline aqueous solution of ethanol containing tetramethylammonium hydroxide to remove a UV-unexposed area, and rinsed with water to form a core layer having desired patterns. The thickness of the resin layer after development was 12 μm, Then, the resin layer was heated at 380° C. for 2 hours in a vacuum atmosphere to remove the solvent remaining in the resin layer and complete imidation of the resin. The thickness of the final cladding layer comprising the polyimide resin thus formed was 10 μm.

Thereafter, the above-mentioned polyamic acid varnish B was applied onto the surface of the core layer by spin coating, and heated at 350° C. for 2 hours to form an overcladding layer having a thickness of 10 μm.

Thus, an embedded type optical waveguide which comprises the synthetic silica substrate, the cladding layer comprising a polyimide, the core layer comprising a polyimide derived from the photosensitive polyimide resin precursor composition and the overcladding layer comprising a polyimide was obtained. After the optical waveguide was subjected to end face treatment, a light having a wavelength of 1,300 nm was passed, and the light propagation loss was measured by a cut-back method. As a result, it was found to be 0.5 dB/cm.

While the present invention has been described in detail and with reference to specific embodiments thereof, it will be apparent to one skilled in the art that various changes and modifications can be made therein without departing from the spirit and scope thereof.

This application is based on Japanese Patent Application No. 2002-346996 filed Nov. 29, 2002, the content thereof being herein incorporated by reference.

What is claimed is:

1. A process for producing a polyimide optical waveguide, which comprises the steps of:
   (a) forming an undercladding layer on a substrate,
   (b) forming a photosensitive polyimide resin precursor composition layer on the undercladding layer,
   (c) irradiating the photosensitive polyimide resin precursor composition layer, excepting a region corresponding to a core pattern, with a UV light through a mask, followed by heating after exposure,
   (d) removing a UV-unexposed area of the photosensitive polyimide resin precursor composition layer by development,
   (e) heating a UV-exposed area of the photosensitive polyimide resin precursor composition layer to imidize the UV-exposed area, thereby forming a cladding layer having a desired pattern,
   (f) coating the region corresponding to the core pattern and a surface of the cladding layer with a polyamic acid that forms a polyimide resin having a higher refraction index than the polyimide resin of the cladding layer, and imidizing the polyamic acid by heating to form a core layer, and (g) forming an overcladding layer on the core layer, wherein the photosensitive polyimide resin precursor composition comprises:

(i) a polyamic acid obtained from a tetracarboxylic dianhydride and a diamine; and (ii) a photosensitive agent comprising a 1,4-dihydropyridine derivative represented by formula (I):

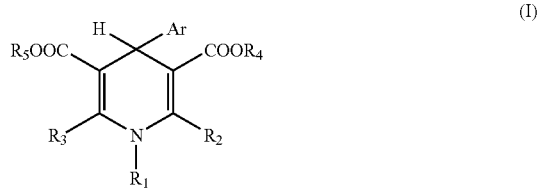

wherein Ar represents an aromatic group having a nitro group at an ortho-position with respect to the bonding position to the 1,4-dihydropyridine ring; $R_1$ represents a hydrogen atom or an alkyl group having 1 to 3 carbon atoms; and $R_2$, $R_3$, $R_4$ and $R_5$ each independently represents a hydrogen atom or an alkyl group having 1 or 2 carbon atoms.

2. The process according to claim 1, wherein the photosensitive polyimide resin precursor composition contains the photosensitive agent in an amount of 0.05 to 10 parts by weight per 100 parts by weight of the polyamic acid.

3. The process according to claim 1 or 2, wherein the photosensitive polyimide resin precursor composition further contains at least one dissolution controlling agent selected from the group consisting of polyethylene glycol, polyethylene glycol monomethyl ether and polyethylene glycol dimethyl ether.

4. The process according to claim 1, wherein the tetracarboxylic dianhydride contains a fluorine atom.

5. The process according to claim 1, wherein the diamine contains a fluorine atom.

6. The process according to claim 1, wherein the 1,4-dihydropyridine derivative represented by formula (I) comprises 1-ethyl-3,5-dimethoxycarbonyl-4-(2-nitrophenyl)-1,4-dihydropyridine.

7. The process according to claim 3, wherein the dissolution controlling agent has a weight-average molecular weight of from 200 to 2,000.

8. The process according to claim 3, wherein the dissolution controlling agent has a weight-average molecular weight of from 300 to 1,000.

9. The process according to claim 3, wherein the photosensitive polyimide resin precursor composition contains the dissolution controlling agent in an amount of from 5 to 50 parts by weight per 100 parts by weight of the polyamic acid.

10. The process according to claim 3, wherein the photosensitive polyimide resin precursor composition contains the dissolution controlling agent in an amount of from 10 to 40 parts by weight per 100 parts by weight of the polyamic acid.

11. A polyimide optical waveguide produced by a process according to claim 1.

* * * * *